United States Patent
Lin et al.

(10) Patent No.: US 11,296,011 B2
(45) Date of Patent: *Apr. 5, 2022

(54) THROUGH-SUBSTRATE VIAS WITH IMPROVED CONNECTIONS

(71) Applicant: Taiwan Semiconductor Manufacturing Company, Ltd., Hsinchu (TW)

(72) Inventors: Jing-Cheng Lin, Hsinchu (TW); Ku-Feng Yang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 68 days.

This patent is subject to a terminal disclaimer.

(21) Appl. No.: 16/459,387

(22) Filed: Jul. 1, 2019

(65) Prior Publication Data

US 2019/0326199 A1 Oct. 24, 2019

Related U.S. Application Data

(60) Continuation of application No. 15/645,928, filed on Jul. 10, 2017, now Pat. No. 10,340,205, which is a
(Continued)

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76816* (2013.01); *H01L 21/76879* (2013.01); *H01L 21/76898* (2013.01); *H01L 23/49827* (2013.01); *H01L 23/5226* (2013.01); *H01L 24/05* (2013.01); *H01L 24/13* (2013.01);
(Continued)

(58) Field of Classification Search
CPC ............. H01L 23/481; H01L 21/76879; H01L 23/5226; H01L 21/76816; H01L 23/49827; H01L 21/76898; H01L 24/14; H01L 2224/0401; H01L 2224/05572; H01L 2224/13025; H01L 2224/13144; H01L 2224/13147; H01L 2224/13155; H01L 2224/14181; H01L 2924/10253
See application file for complete search history.

(56) References Cited

U.S. PATENT DOCUMENTS 5,227,013 A 7/1993 Kumar
5,324,687 A 6/1994 Wojnarowski
(Continued)

*Primary Examiner* — Eugene Lee
(74) *Attorney, Agent, or Firm* — Slater Matsil, LLP

(57) ABSTRACT

A device includes a substrate, and a plurality of dielectric layers over the substrate. A plurality of metallization layers is formed in the plurality of dielectric layers, wherein at least one of the plurality of metallization layers comprises a metal pad. A through-substrate via (TSV) extends from the top level of the plurality of the dielectric layers to a bottom surface of the substrate. A deep conductive via extends from the top level of the plurality of dielectric layers to land on the metal pad. A metal line is formed over the top level of the plurality of dielectric layers and interconnecting the TSV and the deep conductive via.

20 Claims, 11 Drawing Sheets

Related U.S. Application Data division of application No. 15/056,935, filed on Feb. 29, 2016, now Pat. No. 9,704,783, which is a continuation of application No. 12/769,251, filed on Apr. 28, 2010, now Pat. No. 9,293,366.

(51) Int. Cl.
*H01L 23/498* (2006.01)
*H01L 23/522* (2006.01)
*H01L 23/00* (2006.01)

(52) U.S. Cl.
CPC ...... *H01L 24/14* (2013.01); *H01L 2224/0401* (2013.01); *H01L 2224/05572* (2013.01); *H01L 2224/13025* (2013.01); *H01L 2224/13144* (2013.01); *H01L 2224/13147* (2013.01); *H01L 2224/13155* (2013.01); *H01L 2224/14181* (2013.01); *H01L 2224/73204* (2013.01); *H01L 2924/0002* (2013.01); *H01L 2924/01019* (2013.01); *H01L 2924/10253* (2013.01); *H01L 2924/10271* (2013.01); *H01L 2924/10329* (2013.01); *H01L 2924/14* (2013.01)

(56) References Cited

U.S. PATENT DOCUMENTS

| | | | |
|---|---|---|---|
| 5,329,695 A | 7/1994 | Traskos et al. | |
| 5,391,917 A | 2/1995 | Gilmour et al. | |
| 5,489,554 A | 2/1996 | Gates | |
| 5,510,298 A | 4/1996 | Redwine | |
| 5,760,429 A | 6/1998 | Yano et al. | |
| 5,767,001 A | 6/1998 | Bertagnolli et al. | |
| 5,998,292 A | 12/1999 | Black et al. | |
| 6,184,060 B1 | 2/2001 | Siniaguine et al. | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,642,081 B1 * | 11/2003 | Patti | H01L 21/76898 257/E21.597 |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 6,984,892 B2 | 1/2006 | Gotkis et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,902 B2 | 10/2006 | Hatano et al. | |
| 7,122,912 B2 | 10/2006 | Matsui | |
| 7,157,787 B2 | 1/2007 | Kim et al. | |
| 7,193,308 B2 | 3/2007 | Matsui | |
| 7,253,091 B2 | 8/2007 | Brewer et al. | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,354,798 B2 | 4/2008 | Pogge et al. | |
| 7,355,273 B2 | 4/2008 | Jackson et al. | |
| 7,500,306 B2 * | 3/2009 | Carpenter | H05K 1/115 174/264 |
| 7,605,082 B1 | 10/2009 | Reid et al. | |
| 7,608,538 B2 | 10/2009 | Deligianni et al. | |
| 2002/0081838 A1 | 6/2002 | Bohr | |
| 2004/0101663 A1 | 5/2004 | Agarwala et al. | |
| 2007/0090490 A1 | 4/2007 | Chang et al. | |
| 2007/0166997 A1 | 7/2007 | Knorr | |
| 2007/0231950 A1 | 10/2007 | Pozder et al. | |
| 2008/0079461 A1 | 4/2008 | Lin et al. | |
| 2008/0283959 A1 | 11/2008 | Chen et al. | |
| 2008/0303154 A1 | 12/2008 | Huang et al. | |
| 2009/0008790 A1 * | 1/2009 | Lee | H01L 23/481 257/774 |
| 2009/0014888 A1 | 1/2009 | Lee et al. | |
| 2009/0051039 A1 | 2/2009 | Kuo et al. | |
| 2009/0102021 A1 | 4/2009 | Chen et al. | |
| 2009/0160051 A1 | 6/2009 | Lee | |
| 2009/0160058 A1 | 6/2009 | Kuo et al. | |
| 2009/0170242 A1 | 7/2009 | Lin et al. | |
| 2009/0315154 A1 | 12/2009 | Kirby et al. | |
| 2010/0084747 A1 | 4/2010 | Chen et al. | |
| 2010/0187671 A1 | 7/2010 | Lin et al. | |
| 2010/0264551 A1 | 10/2010 | Farooq et al. | |

* cited by examiner

THROUGH-SUBSTRATE VIAS WITH IMPROVED CONNECTIONS

PRIORITY CLAIM

This application is a continuation of U.S. patent application Ser. No. 15/645,928, filed on Jul. 10, 2017 and entitled "Through-Substrate Vias with Improved Connections," which is a divisional of U.S. patent application Ser. No. 15/056,935, filed on Feb. 29, 2016, now U.S. Pat. No. 9,704,783 issued on Jul. 11, 2017, and entitled "Through-Substrate Vias with Improved Connections," which application claims the benefit to and is a continuation of U.S. patent application Ser. No. 12/769,251, filed on Apr. 28, 2010, now U.S. Pat. No. 9,293,366 issued on Mar. 22, 2016, and entitled "Through-Substrate Vias with Improved Connections" which applications are incorporated herein by reference.

TECHNICAL FIELD

This disclosure relates generally to integrated circuit structures, and more particularly to forming through-substrate vias with improved electrical connections.

BACKGROUND

Among the efforts for reducing the size of integrated circuits and reducing RC delay, three-dimensional integrated circuit (3DIC) and stacked dies are commonly used. Through-substrate vias (TSVs) are thus used in 3DIC and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

There are two commonly used approaches for forming TSVs, via-first approach and via-last approach. When formed using the via-first approach, vias are formed before the back-end-of-line (BEOL) processes are performed. Accordingly, the TSVs are formed before the formation of metallization layers. Due to the thermal budget in the BEOL processes, however, the TSVs formed using the via-first approach suffer from problems such as copper popping and metal-1 to metal-2 bridging.

On the other hand, the via-last approach, although being cost effective and having a short time-to-market, the resulting structures are less efficient in power connection. For example, FIGS. 1 and 2 illustrate two interconnect structures comprising via-last TSVs. In FIG. 1, die 4 is bonded to die 2 through a face-to-face bonding. In FIG. 2, die 4 is bonded to die 2 through a face-to-back bonding. TSVs 6 are formed in dies 2, and are used for connecting power to the devices in dies 2. It is observed that regardless whether the power is introduced into die 2 from bump 12 as in FIG. 1, or introduced into die 2 from die 4 as in FIG. 2, the connection of the power to device 8 in dies 4 have long paths, as illustrated by arrows 14. Further, each of the long power paths 14 includes a plurality of metal lines and vias. Accordingly, the resistances of the power paths are also high.

SUMMARY

In accordance with one aspect, a device includes a substrate, and an interconnect structure over the substrate. The interconnect structure includes a plurality of metallization layers including a bottom metallization layer (M1) and a top metallization layer (Mtop). A dielectric layer is over the Mtop. A through-substrate via (TSV) is formed to extend from a top surface of the dielectric layer to a bottom surface of the substrate. A deep conductive via is formed to extend from the top surface of the dielectric layer to land on a metal pad in one of the plurality of metallization layers. A metal line is over the dielectric layer and interconnects the TSV and the deep conductive via.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming through-silicon vias (TSVs, also sometimes known as through-silicon vias when they are formed in a silicon substrate) is provided. The intermediate stages of manufacturing an embodiment are illustrated. The variations of the embodiment are then discussed. Throughout the various views and illustrative embodiments, like reference numbers are used to designate like elements.

Figure 1:
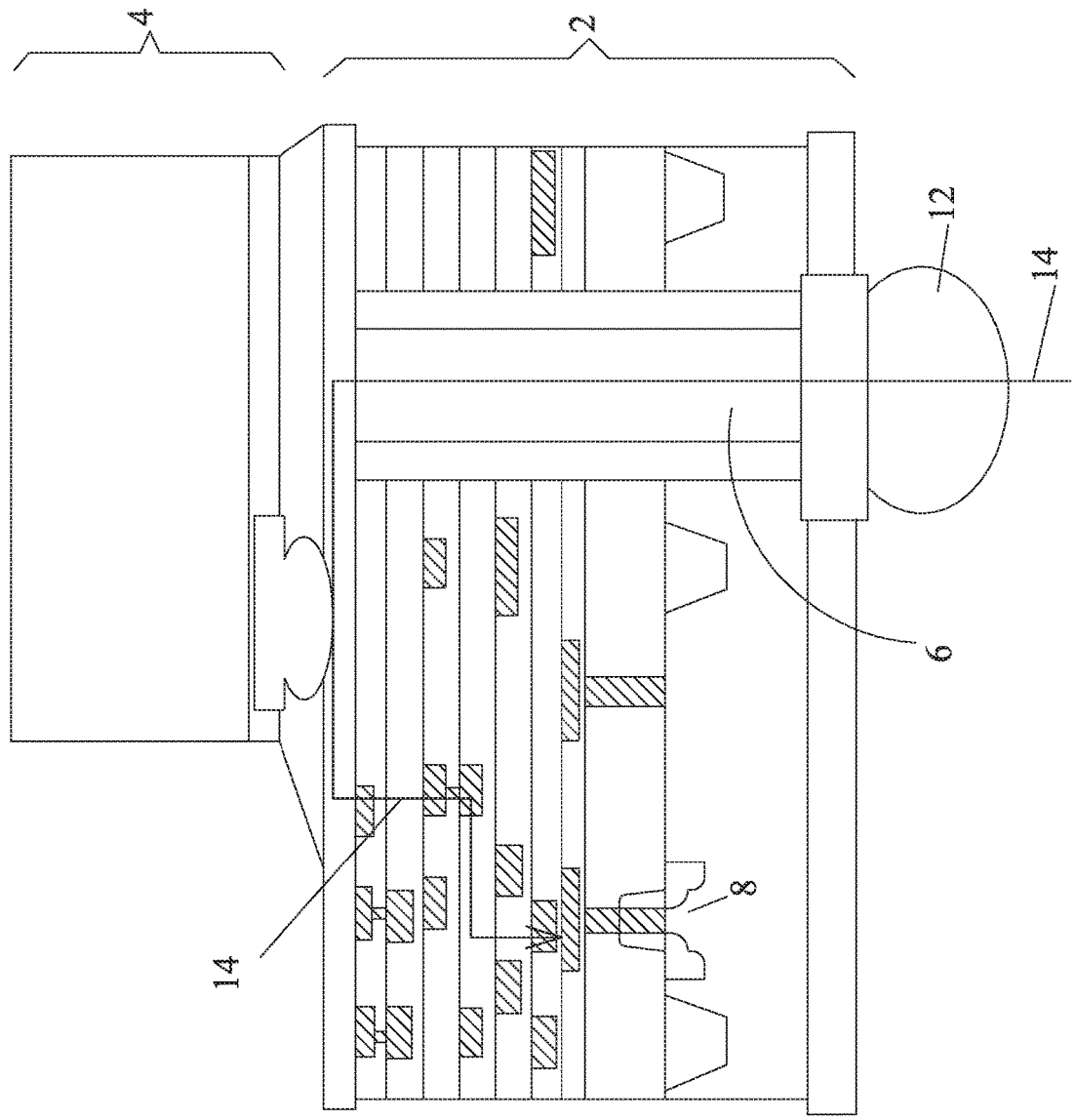
FIGS. 1 and 2 illustrate conventional connections of power into dies through through-substrate vias (TSVs)
Figure 2:
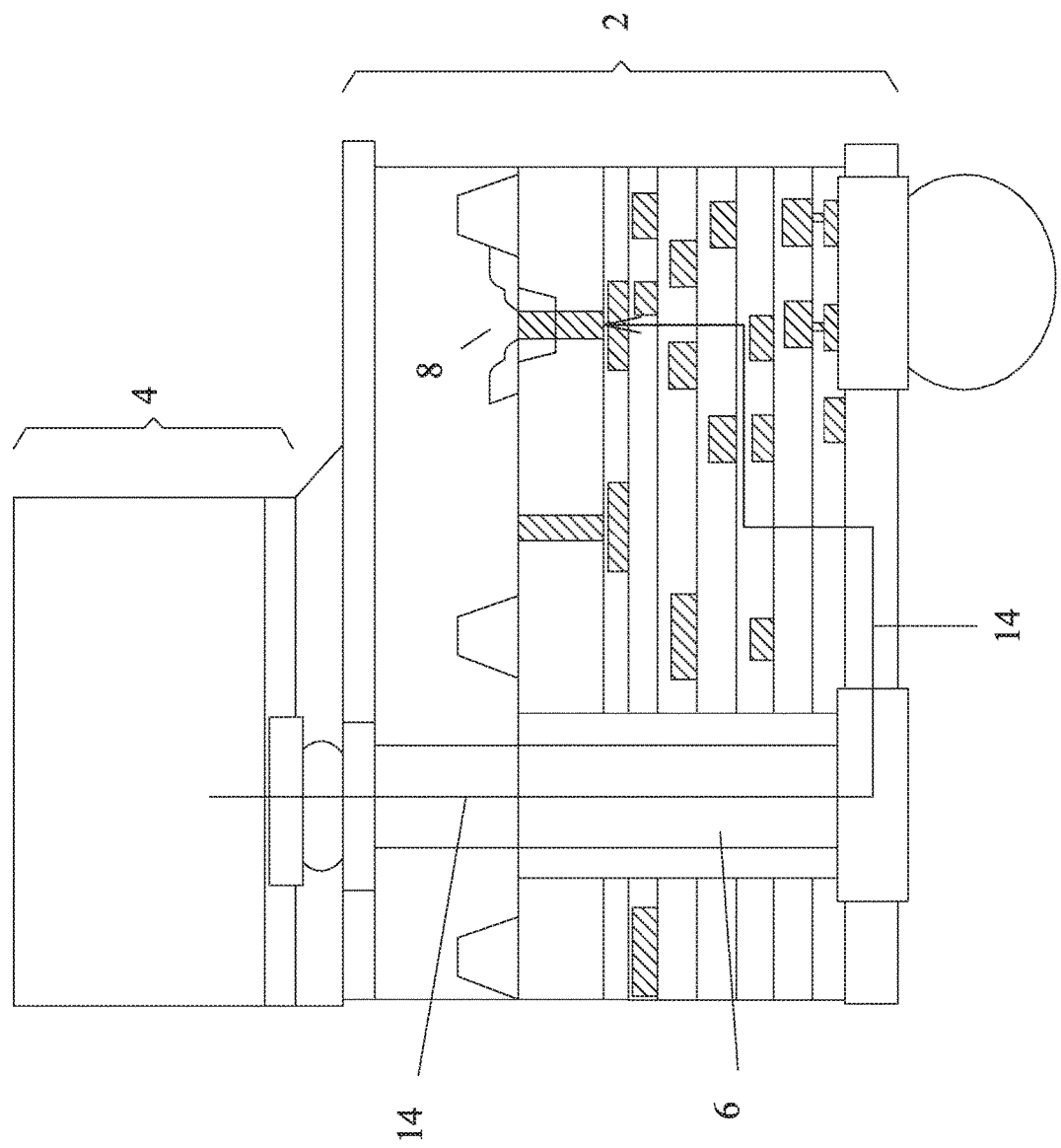
Figure 3:
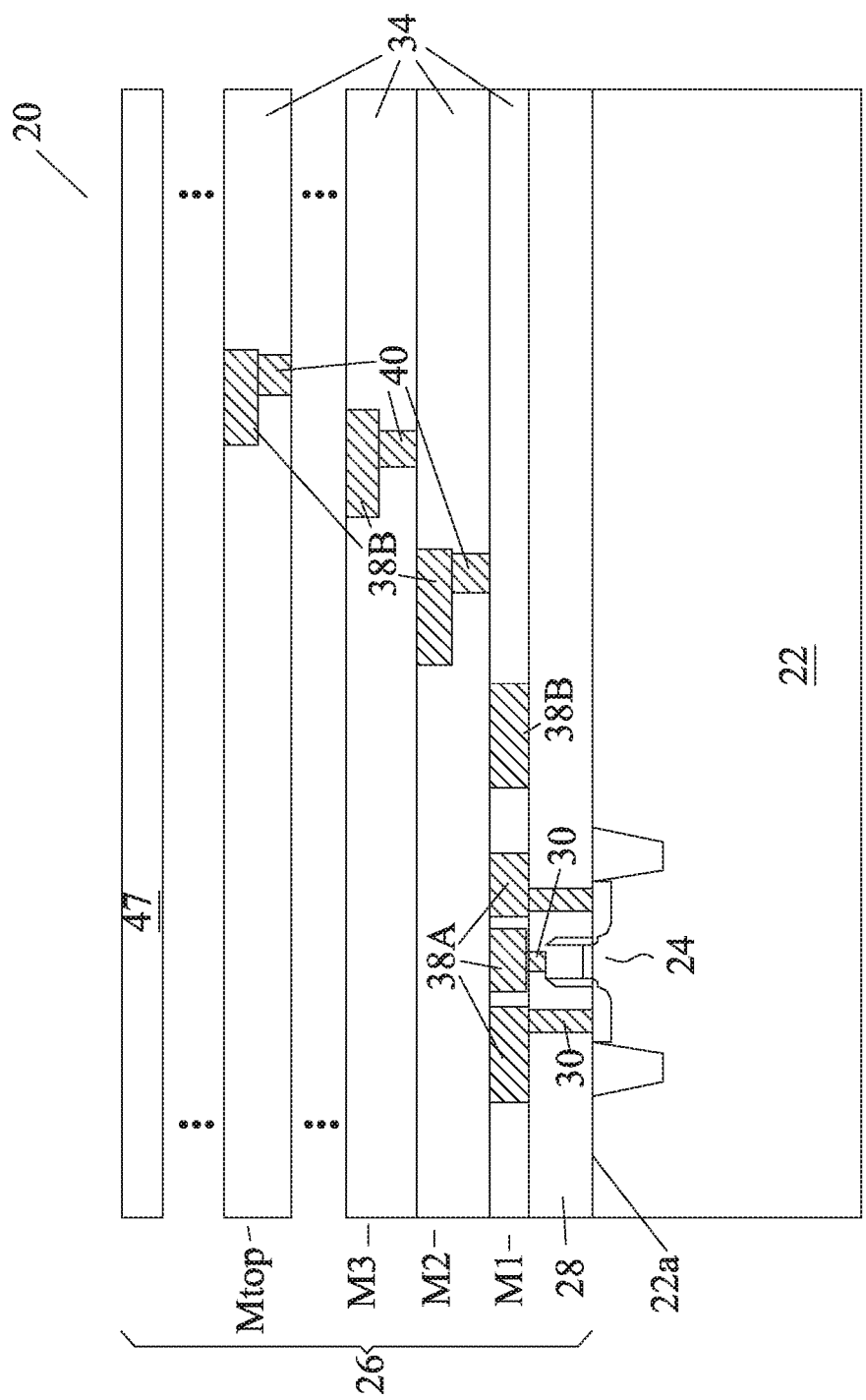
FIGS. 3 through 9 are cross-sectional views of intermediate stages in the manufacturing of a wafer comprising a TSV and deep conductive vias connected to the TSV in accordance with various embodiments.

Referring to FIG. 3, wafer 20, which includes substrate 22 and integrated circuits 24 (symbolized by a transistor) therein, is provided. In accordance with various embodiments, wafer 20 is a device wafer comprising active integrated circuit devices such as transistors. Substrate 22 may be a semiconductor substrate, such as a bulk silicon substrate, although it may be formed of other semiconductor materials such as silicon germanium, gallium arsenide, and/or the like. Semiconductor devices such as transistors (a symbolized by transistor 24) may be formed at the front surface 22a of substrate 22. Interconnect structure 26 is formed on the front side of substrate 22. Interconnect structure 26 may include inter-layer dielectric (ILD) 28 (in which the electrodes of transistor is located) and contact plugs 30 in ILD 28, wherein contact plugs 30 may be formed of tungsten or other metallic materials.

Furthermore, interconnect structure 26 include inter-metal dielectrics (IMDs) 34, and metal lines/pads 38 (including 38A and 38B) and vias 40 in IMDs 34. IMDs 34 may be formed of low-k dielectric materials having low k values, for example, lower than about 2.5, or even lower than about 2.0. Interconnect structure 26 may include a bottom metallization layer (commonly known as M1) and a top metallization layer (commonly known as Mtop), and a plurality of metallization layers therebetween, including the metallization layer (M2) immediately over M1, the metallization layer (M3) immediately over M2, and the like. As used throughout the specification and as illustrated by the figures including FIGS. 3 through 11, the term metallization layer refers to both the conductive features in a particular layer or level of interconnect structure 26, as well as the particular IMD in which those conductive features are embedded. As an example with reference to FIG. 3, M2 refers to the lowermost via 40 and its associated metal pad 38 as well as the IMD layer 34 in which they are embedded, Mtop refers to the uppermost via 40 and its associated metal pad 38 as well as the uppermost IMD layer 34 in which they are embedded, etc. The metal features in interconnect structure 26 may be electrically coupled to semiconductor devices 24. Metal lines/pad 38 and vias 40 may be formed of copper or copper alloys, and may be formed using the well-known damascene processes. Metal lines/pads 38 include metal lines 38A and metal pads 38B, with metal pads 38B being used for landing the subsequently formed deep vias.

Interconnect structure 26 may further include one or more passivation layer(s) 47 that is immediately over metallization layer Mtop. Passivation layer 47 may be a non-low-k dielectric layer, and may be formed of silicon oxide, silicon nitride, un-doped silicate glass, polyimide, or the like. Further, additional metal lines/pads and vias (not shown) may be formed in passivation layer(s) 47.

Figure 11:
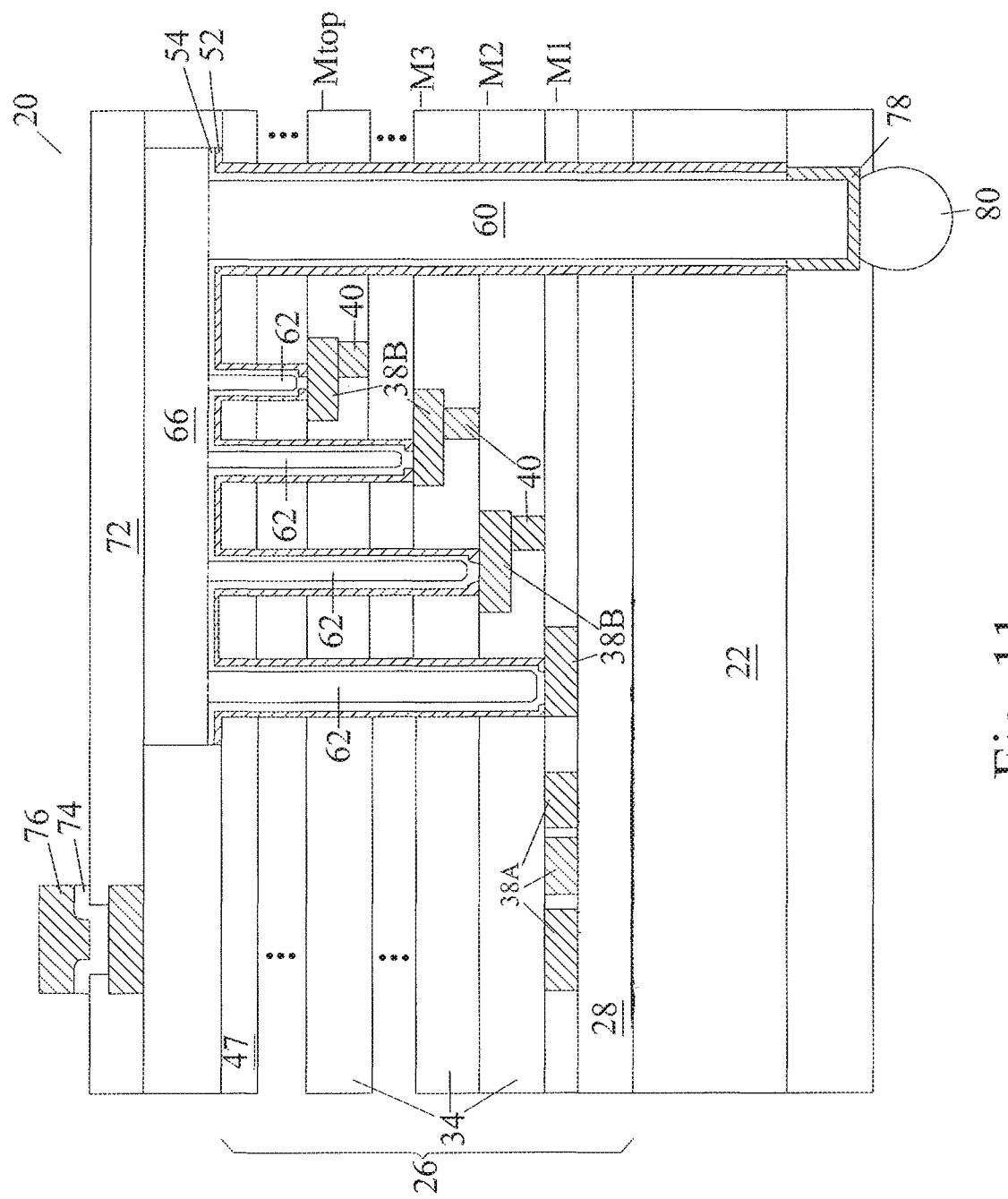
FIG. 11 illustrates a wafer comprising a TSV and deep conductive vias, wherein the TSV extends through a substrate that is substantially free from an integrated circuit device.

In alternative embodiments, such as in the example of FIG. 11, wafer 20 is an interposer wafer, and is substantially free from integrated circuit devices, including active devices such as transistors and diodes formed therein. In these embodiments, substrate 22 may be formed of a semiconductor material or a dielectric material. The dielectric material may be silicon oxide, an organic material such as polyimide, a hybrid material such as molding compound, glass, or the like. Furthermore, interposer wafer 20 may include, or may be free from, passive devices such as capacitors, resistors, inductors, varactors, and/or the like.

Figure 4:
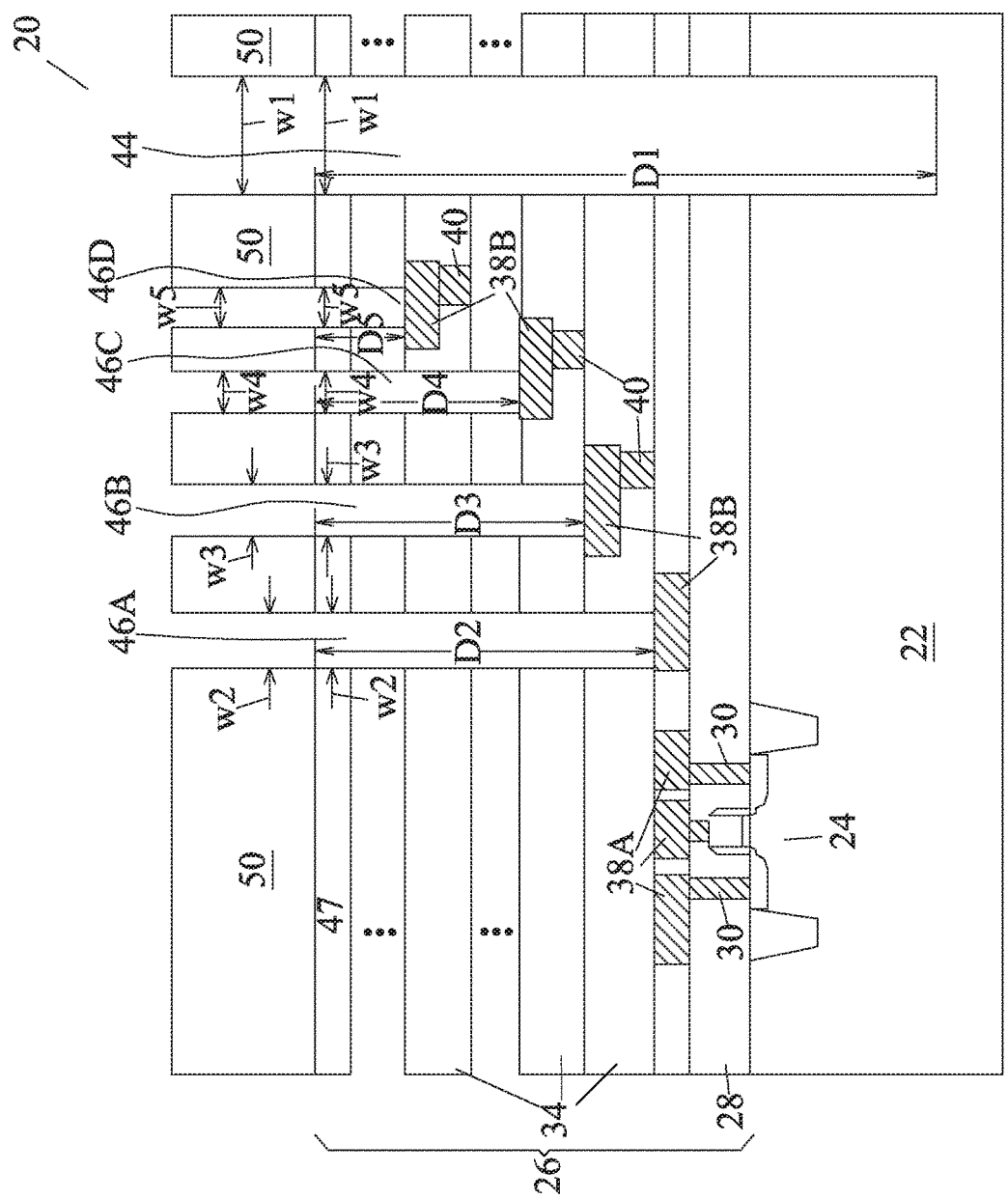

Referring to FIG. 4, after the formation of interconnect structure 26, which may or may not include layer(s) 47, TSV opening 44 and deep via openings 46 (including 46A, 46B, 46C, 46D, and possibly more that are not illustrated) are formed. In an embodiment, photo resist 50 is formed and patterned. TSV opening 44 and deep via openings 46 are then formed simultaneously by etching. TSV opening 44 extends into substrate 22, while deep via openings 46 stop at respective metal pads 38B, with metal pads 38B exposed through deep vias 46. Further, the formation of deep via openings 46 may stop at metal pads 38B in any one of different metallization layers ranging from M1 through Mtop in any desirable combination.

In an embodiment, pattern loading effect is used to form TSV opening 44 and deep vias openings 46, which have different depths, simultaneously. It is observed that when certain via openings are formed, the via openings having greater horizontal sizes may have greater depths than the via openings having smaller sizes, even if they are formed by a same etching process. As a result of the pattern loading effect in the etching process, and also due to the size difference between TSV opening 44 and deep via openings 46, the resulting TSV opening 44 and deep via openings 46 will have different depths. With properly adjusted horizontal sizes W1 through W5, when the desirable depth D1 of TSV opening 44 is reached, desirable depths D2, D3, D4, D5, and the like are also reached. This may reduce the undesirable over-etching of metal pads 38B, and hence the undesirable damage to metal pads 38B may be minimized. Accordingly, the horizontal dimension W1 (which may be a diameter or a length/width, depending on the shape of TSV opening 44) of TSV opening 44 is greater than horizontal dimensions W2, W3, W4, and W5 of deep via openings 46. In an embodiment, a ratio of W1/W2 (or W1/W3, W1/W4, and so on) may be greater than about 1.5, greater than about 5, or even greater than about 100. Further, depth D1 of TSV opening 44 is greater than depth D2 of deep via openings 46. In an embodiment, a ratio of D1/D2 (or D1/D3, D1/D4, and so on) may be greater than about 5, or even greater than about 5,000. Further, in the illustrated embodiments, W2 may be greater than W3 with ratio W2/W3 being greater than about 1.2, W3 may be greater than W4 with ratio W3/W4 being greater than about 1.2, and W4 may be greater than W5 with ratio W4/W5 being greater than about 1.2.

Figure 5:
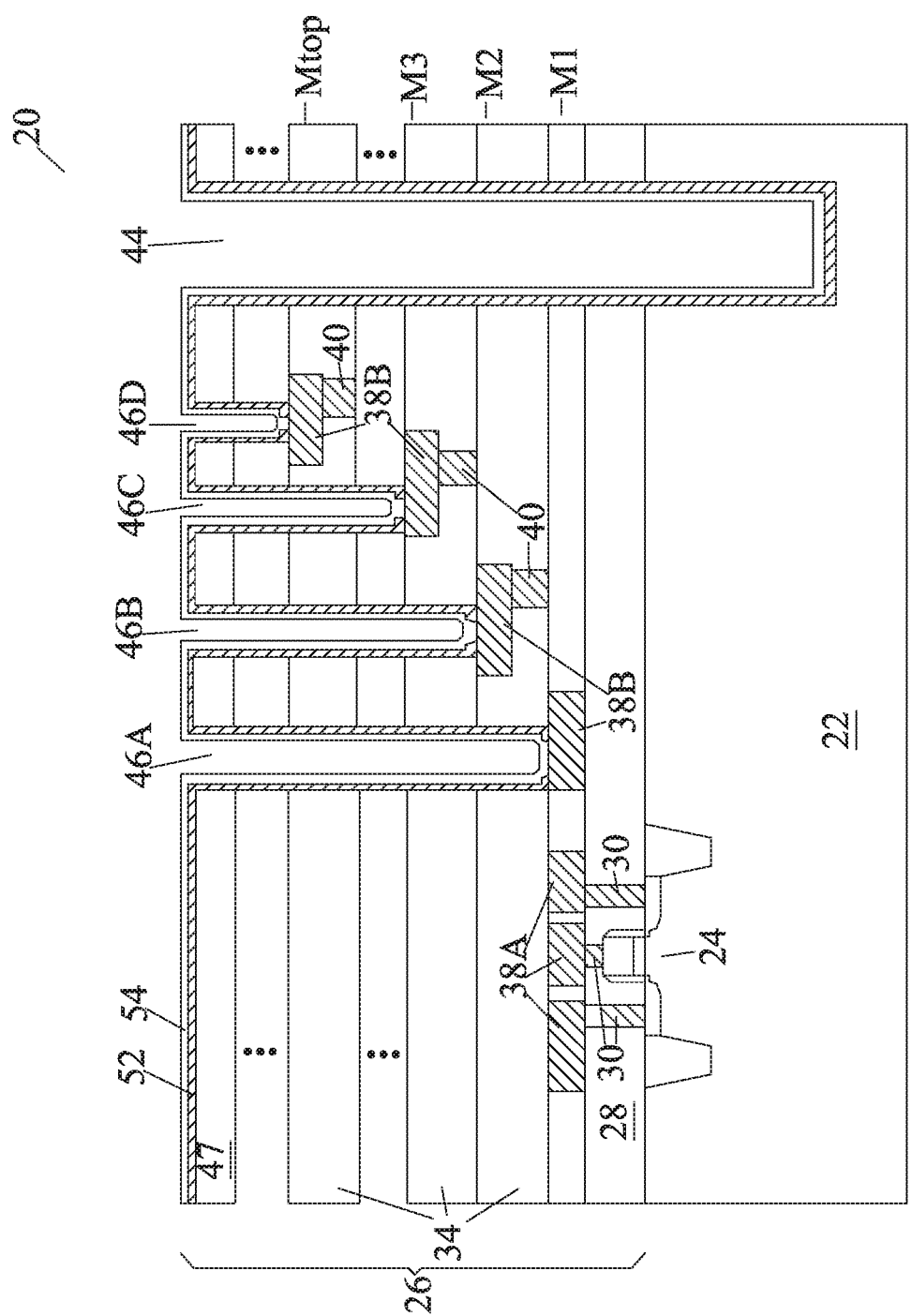

Referring to FIG. 5, insulation layer 52 is formed and patterned, and metal pads 38B are exposed through the openings in insulation layer 52. Next, diffusion barrier layer 54, also referred to as a glue layer, is blanket formed, covering the sidewalls and the bottom of TSV opening 44. Diffusion barrier layer 54 may include commonly used barrier materials such as titanium, titanium nitride, tantalum, tantalum nitride, and combinations thereof, and can be formed using physical vapor deposition, for example. Next, a thin seed layer (not shown) may be blanket formed on diffusion barrier layer 54. The materials of the seed layer may include copper or copper alloys, and metals such as silver, gold, aluminum, and combinations thereof may also be included. In an embodiment, the seed layer is formed of sputtering. In other embodiments, other commonly used methods such as electro or electroless plating may be used.

Figure 6:
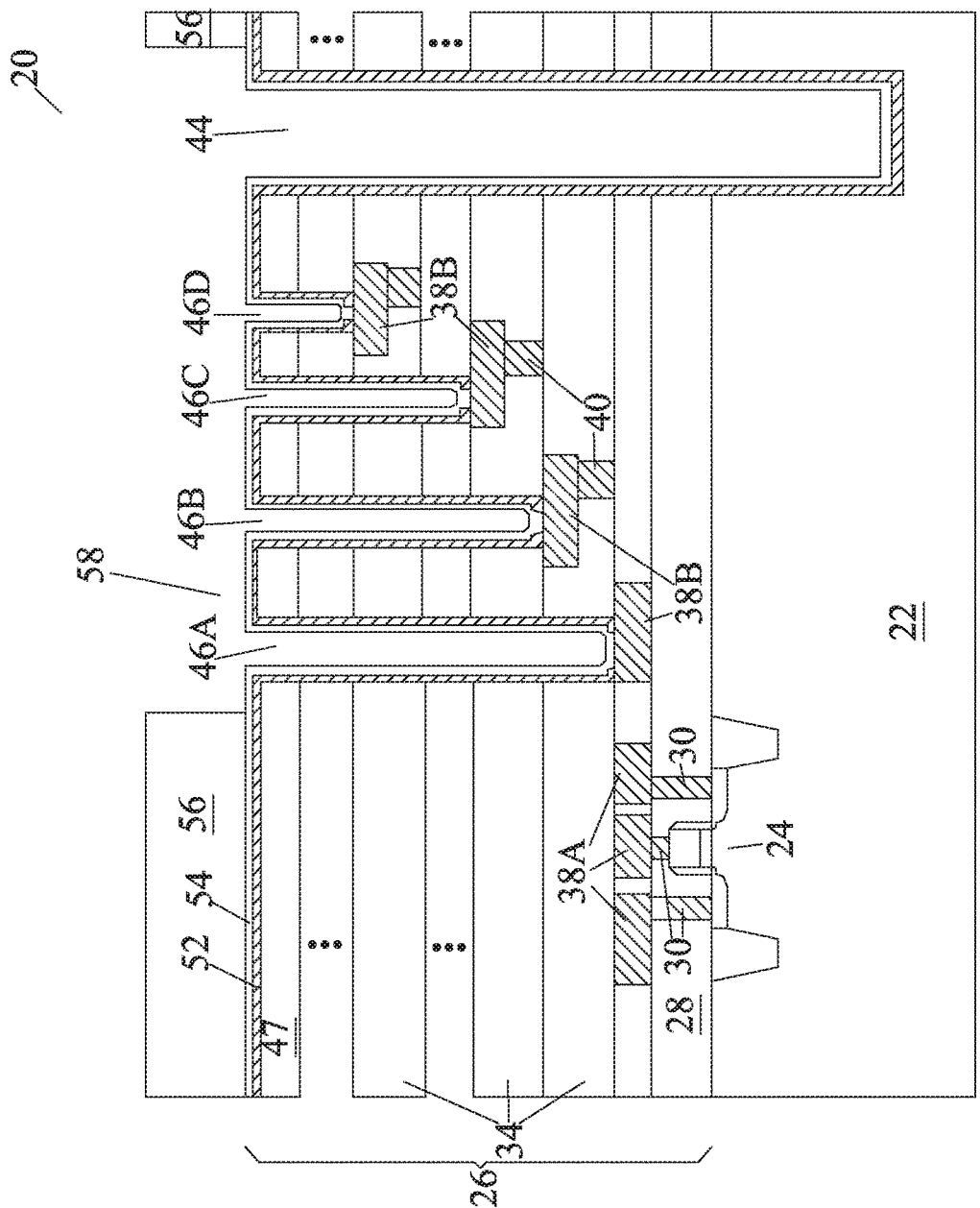

Referring to FIG. 6, mask 56 is formed on the previously formed structure. In an embodiment, mask 56 comprises a photo resist, for example. Mask 56 is then patterned. In an exemplary embodiment, the resulting TSV needs to be connected to metal pads 38B. Accordingly, opening 58 is formed in mask 56, exposing TSV opening 44 and deep via openings 46.

Figure 7:
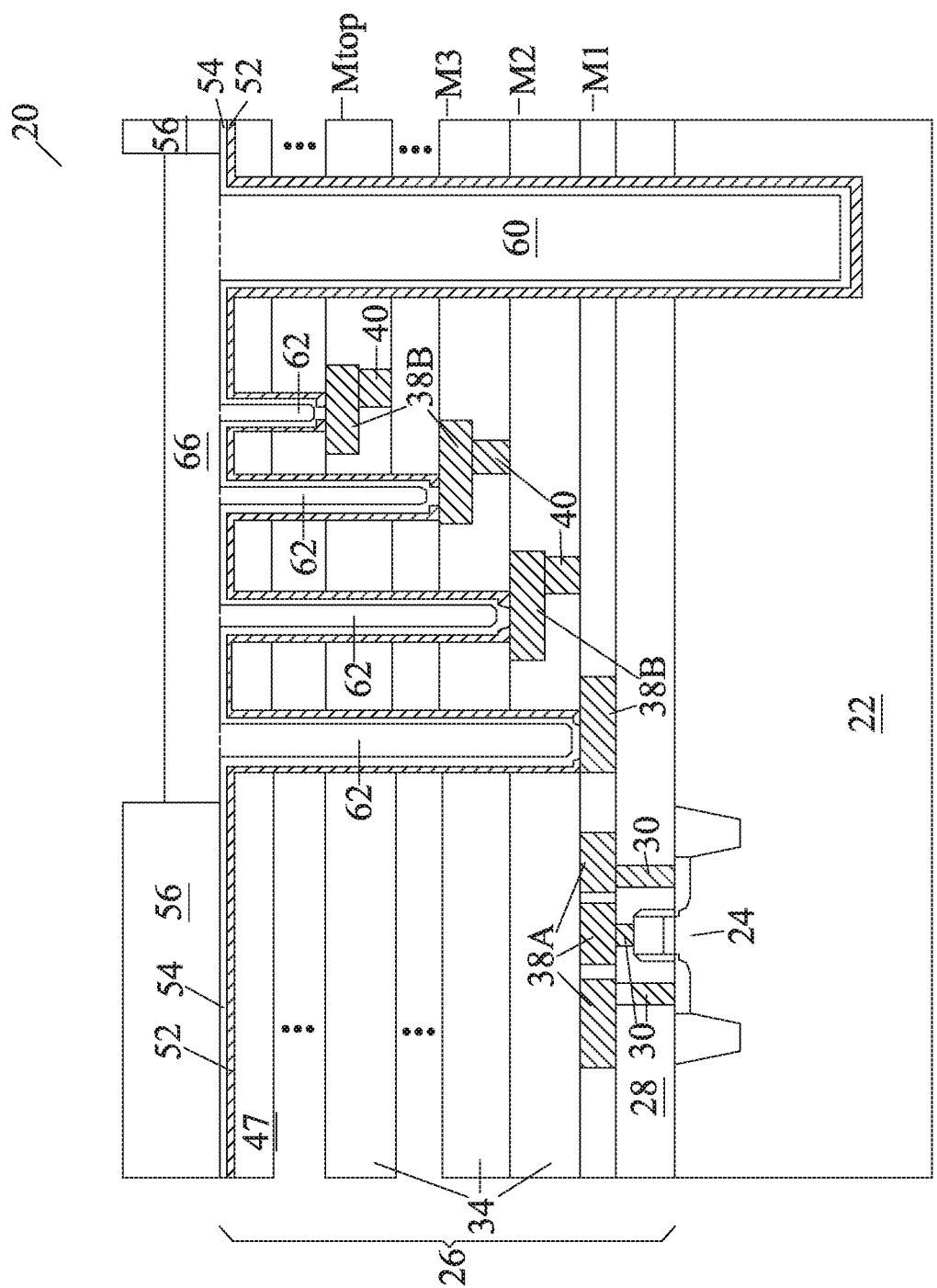

In FIG. 7, a metallic material is filled into openings 44, 46, and 58, forming TSV 60 in TSV opening 44, deep conductive vias 62 in deep via openings 46, and metal line 66 in the opening 58. In various embodiments, the filling material includes copper or copper alloys, although other metals, such as aluminum, silver, gold, and combinations thereof, may also be used. The formation methods may include printing, electro plating, electroless plating, and the like. In the same deposition process in which TSV opening 44 is filled with the metallic material, the same metallic material may also be filled in opening 58, forming metal line 66, which is also referred to a redistribution line.

Figure 8:
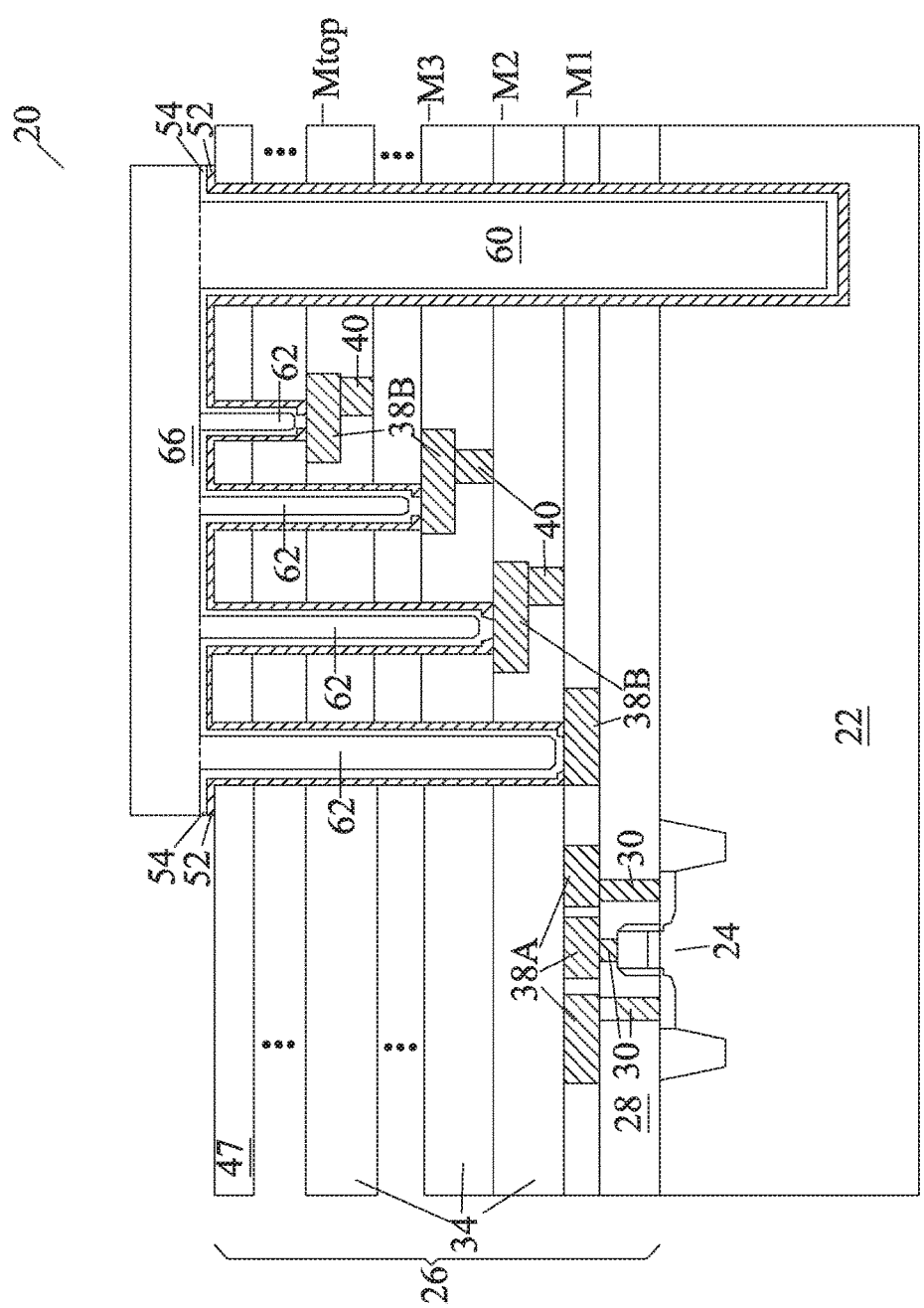
Figure 9:
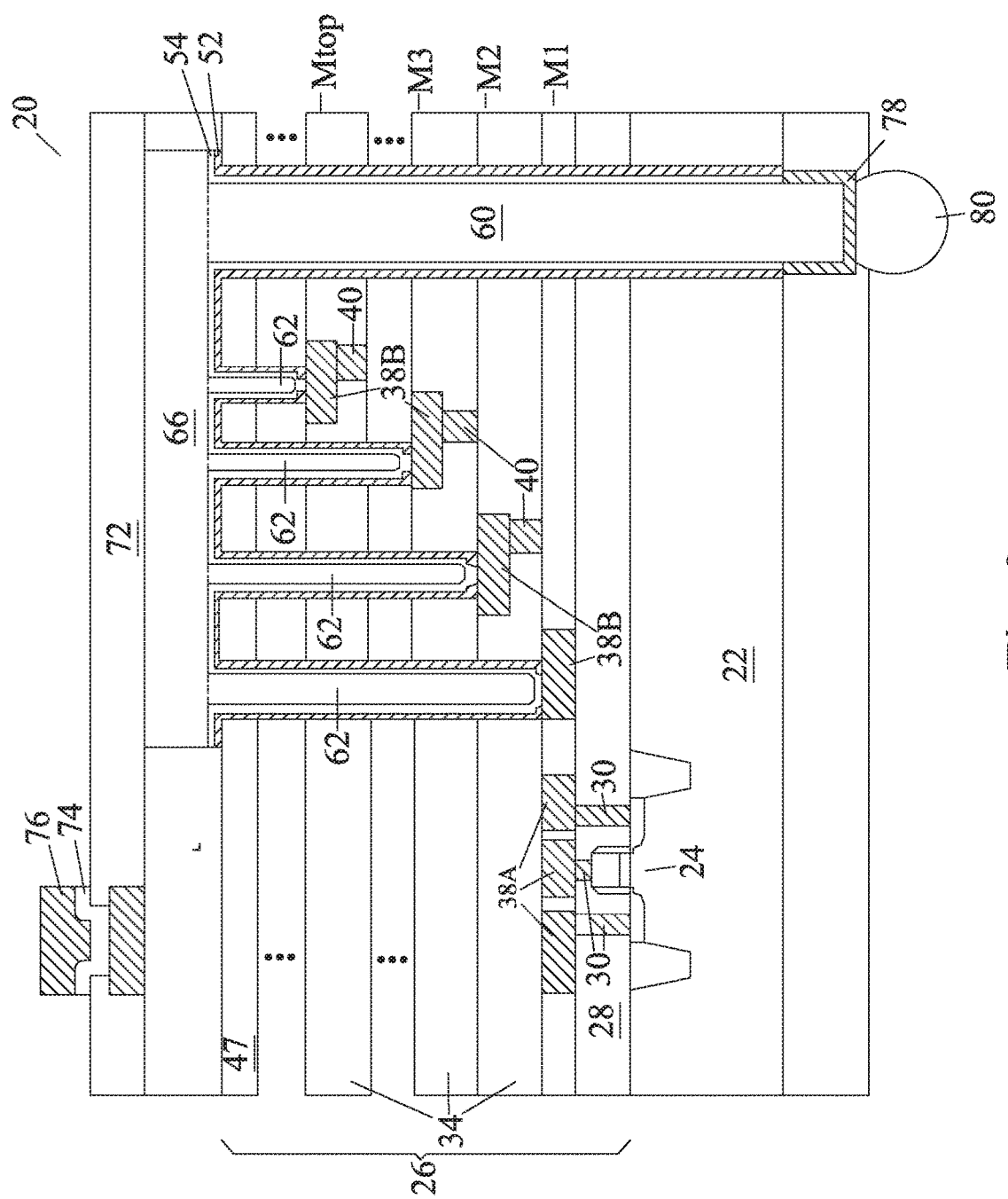

Next, as is shown in FIG. 8, mask 56 is removed. Passivation layer(s) 72 and Under-bump metallurgy (UBM) 74 may then be formed, as shown in FIG. 9. Metal bump 76 is also formed. Metal bump 76 may be a solder bump, a copper bump, and may include other layers/materials such as nickel, gold, solder, and/or the like.

After the formation of Metal bump 76, the backside of wafer 20 may be grinded, so that TSV 60 is exposed. A backside interconnect structure, which may include UBM 78 and bond pad/metal bump 80, is then formed on the backside of wafer 20. Further, a backside interconnect structure (not shown) including a plurality of redistribution layers may be formed between, and electrically coupling, TSV 60 and metal bump 80.

Figure 10:
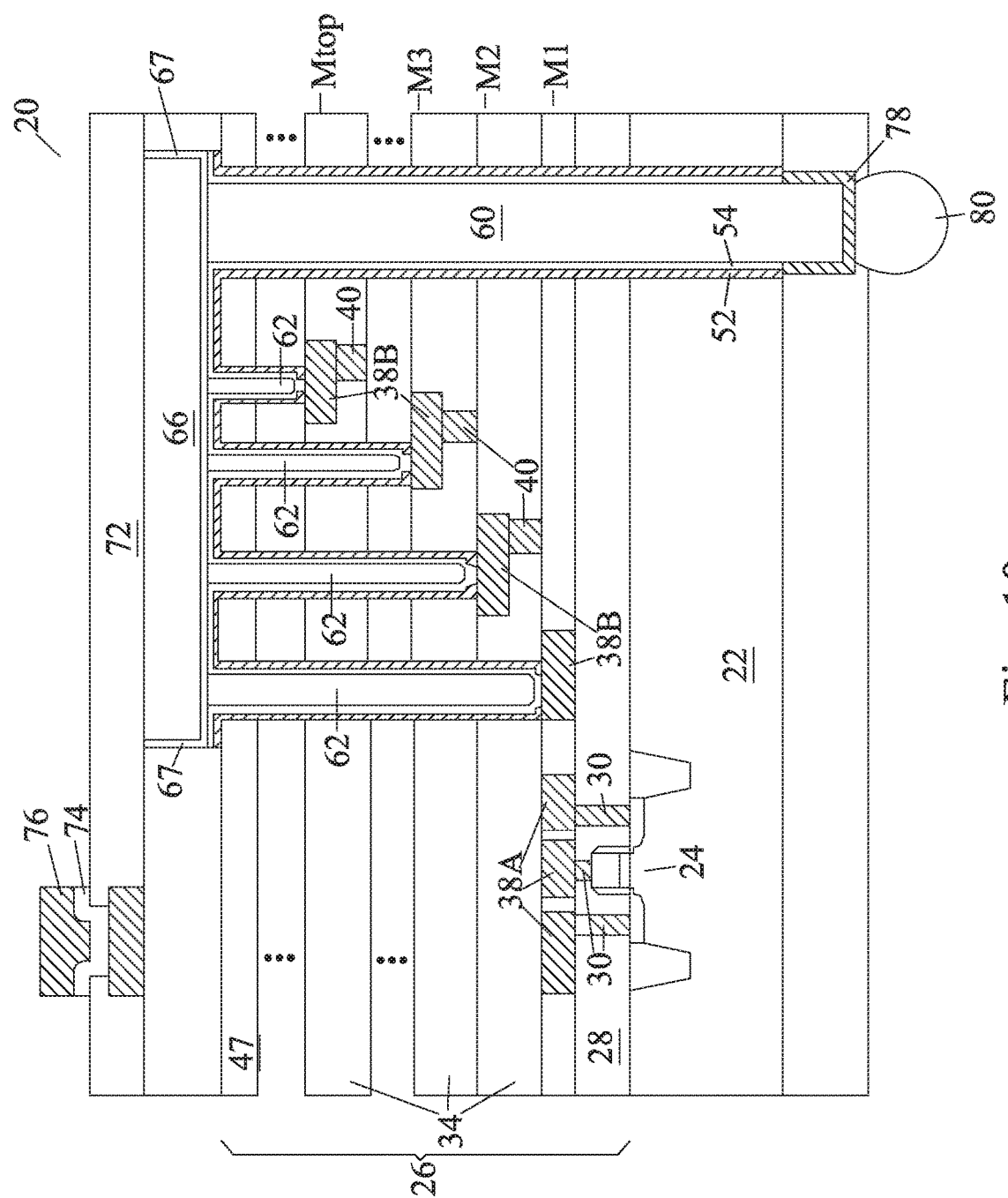
FIG. 10 illustrates a wafer comprising a TSV and deep conductive vias, wherein a metal line connecting the TSV and the deep conductive vias is formed in a process step separated from the process step for forming the TSV and the deep conductive via.

FIG. 10 illustrates an alternative embodiment. This embodiment is essentially the same as the embodiment shown in FIG. 9, except that metal line 66 is not formed in the same process as forming TSV 60 and deep vias 62. In the respect formation process, after the formation of the structure shown in FIG. 5, TSV opening 44 and deep via openings 46 are filled, followed by a planarization process such as a chemical mechanical polish (CMP) to remove excess metal, and hence TSV 60 and deep vias 62 are formed. However, after the CMP, TSV 60 and deep vias 62 are electrically disconnected from each other. Next, metal line 66 is formed to electrically couple TSV 60 to deep vias 62. In the resulting structure, diffusion barrier layer 67 separates TSV 60 and deep vias 62 from metal line 66. Diffusion barrier layer 67 may comprise titanium, titanium nitride, tantalum, tantalum nitride, or the like. In the structure shown in FIG. 9, however, no diffusion barrier layer is formed to separate TSV 60 and deep vias 62 from metal line 66.

Although in the illustrated figures, device dies including semiconductor devices are used as examples, the teaching provided by the embodiments may be readily applied to interposers comprising no integrated circuits such as transistors, resistors, diodes, capacitors, and/or the like. Similarly, by using the embodiments, deep vias can be formed on interconnect structures on either one, or both, of the frontside interconnect structure and backside interconnect structure, with the deep vias connected to TSVs in interposers.

In the embodiments, with the formation of deep vias 62, the power (or signal) introduced to TSV 60 may be provided to metal pads 38B through deep vias 62 that have different lengths. Compared to conventional via-last structures, the paths to metal features that are on different metallization layers are significantly shortened. As a result, the power connection efficiency is improved.

In some aspects, embodiments described herein provide for a method of manufacturing a device that includes etching a first opening in a dielectric structure, the dielectric structure comprising a plurality of metallization layers formed in a plurality of respective dielectric layers, wherein the first opening exposes a metal pad disposed in at least one of the plurality of dielectric layers. The method also includes etching a second opening through the dielectric structure and into a portion of a substrate disposed below the dielectric structure, wherein the etching the first opening and the etching the second opening occur simultaneously, and simultaneously filling the first opening and the second opening with a conductive material.

In other aspects, embodiments described herein provide for a method of manufacturing a device including forming a interconnect structure over a substrate, the interconnect structure including a plurality of conductive pads formed in respective dielectric layers of a plurality of dielectric layers. The method also includes etching a first opening aligned with a first conductive pad, the first opening having a first width, and simultaneously with etching the first opening, etching a second opening that extends at least partially through the substrate, the second opening have a second width greater than the first width. The method also includes simultaneously forming a first conductive via in the first opening and a second conductive via in the second opening.

In yet other aspects, embodiments described herein may provide for a device comprising a substrate and an interconnect structure over the substrate. The interconnect structure comprises a plurality of low-k dielectric layers, and a plurality of metallization layers in the plurality of low-k dielectric layers and comprising metal pads, wherein the metal pads comprises copper, and a dielectric layer over the plurality of metallization layers, wherein a k value of the dielectric layer is higher than k values of the plurality of low-k dielectric layers. The device further includes a through-substrate via (TSV) extending from a top surface of the dielectric layer to a bottom surface of the substrate, a first deep conductive via extending from the top surface of the dielectric layer to land on a first metal pad in a first one of the plurality of metallization layers, and a second deep conductive via extending from the top surface of the dielectric layer to land on a second metal pad in a second one of the plurality of metallization layers different from the first one. A metal line is over the dielectric layer and electrically couples the TSV to the first and the second deep conductive vias.

One general aspect of embodiments disclosed herein includes a device including: a substrate; an interconnect structure over the substrate, the interconnect structure including: a plurality of low-k dielectric layers; a plurality of metallization layers in the plurality of low-k dielectric layers and including metal pads, where the metal pads includes copper; and a dielectric layer over the plurality of metallization layers, where a k value of the dielectric layer is higher than k values of the plurality of low-k dielectric layers; a through-substrate via (TSV) extending from a top surface of the dielectric layer to a bottom surface of the substrate; a first deep conductive via extending from the top surface of the dielectric layer to land on a first metal pad in a first one of the plurality of metallization layers; a second deep conductive via extending from the top surface of the dielectric layer to land on a second metal pad in a second one of the plurality of metallization layers different from the first one; and a metal line over the dielectric layer and electrically coupling the TSV to the first and the second deep conductive vias.

Another general aspect of embodiments disclosed herein includes a device including: a substrate; an interconnect structure on the substrate, the interconnect structure including stacked metallization layers; a dielectric layer over the stacked metallization layers; a first conductive via extending from a top surface of the dielectric layer to at least partially into the substrate; a second conductive via extending from the top surface of the dielectric layer to a metal pad of the interconnect structure; and a single continuous metal feature filling the first conductive via, extending over the top surface of the dielectric layer, and filling the conductive second via.

Yet another general aspect of embodiments disclosed herein includes a device including: a substrate, an interconnect structure over the substrate, a through-substrate via (TSV) extending from the top level of the interconnect structure to a bottom surface of the substrate, a deep conductive via extending from the top level of the interconnect structure and contacting a metal pad in the interconnect structure, a barrier layer extending between the deep conductive via and the interconnect structure, a metal line over the top level of the interconnect structure extending continuously from the TSV to the deep conductive via, and a passivation layer over the metal line.

One general aspect of embodiments disclosed herein includes a device including: a substrate; an interconnect structure over the substrate, the interconnect structure including a stacked plurality of metal layers, the interconnect structure having a topmost metal layer surface; and a dielectric layer over the topmost metal layer surface, where a k value of the dielectric layer is higher than k values of the plurality of low-k dielectric layers; a through-substrate via (TSV) extending through the dielectric layer and into the substrate; a first conductive via extending through the dielectric layer and terminating on a first layer of the stacked plurality of metal layers; a second conductive via extending through the dielectric layer and terminating on a second metal layer of the stacked plurality of metal layers different from the first layer of the stacked plurality of metal layers; and a conductor above the interconnect structure and electrically coupling the TSV to the first and the second conductive vias.

Another general aspect of embodiments disclosed herein includes a device including: a substrate; an interconnect structure over the substrate, the interconnect structure including: a plurality of metallization layers including: a bottom metallization layer (M1); an intermediate metallization layer (M2) over the m1 layer; a second metallization layer (M3) over the m2; and a top metallization layer (Mtop) over the M2; and a through-substrate via (TSV) extending from the Mtop to a bottom surface of the substrate; a first conductive via extending from a top surface of the Mtop through at least a bottom surface of the Mtop and physically and electrically contacting the m2; a second conductive via extending from a top surface of the Mtop through at least a bottom surface of the Mtop and physically and electrically contacting the m3; and a metal line electrically connecting the TSV and one of the first conductive via and the second conductive via.

Yet another general aspect of embodiments disclosed herein includes a device including: a plurality of dielectric layers; a plurality of metallization layers formed respectively in the plurality of dielectric layers; a first conductive via extending from the top level of the plurality of dielectric layers and physically and electrically connecting with a first metallization layer of the plurality of metallization layers; a second conductive via extending from the top level of the plurality of dielectric layers and physically and electrically connecting with a second metallization layer of the plurality of metallization layers, the second metallization layer being above the first metallization layer; a metal line over the top level of the plurality of dielectric layers, the metal line electrically connecting the first conductive via to a through-substrate via (TSV); and a passivation layer covering the metal line.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a substrate;
an interconnect structure over the substrate, the interconnect structure comprising a stacked plurality of metal layers the plurality of metal layers including respective metal features embedded within respective ones of a plurality of low-k dielectric layers, the interconnect structure having a topmost metal layer surface; and
a passivation layer on and directly over the topmost metal layer surface, wherein a k value of the passivation layer is higher than k values of the plurality of low-k dielectric layers;
a through-substrate via (TSV) extending through the passivation layer and into the substrate;
a first conductive via on a first side of the TSV and laterally spaced apart from at least one metal feature of the interconnect structure and extending through the passivation layer and terminating on a first metal pad in a first metal layer of the stacked plurality of metal layers;
a second conductive via on the first side of the TSV and laterally spaced apart from at least one other metal feature of the interconnect structure and extending through the passivation layer, extending through the first layer of the stacked plurality of metal layers, and terminating on a second metal pad in a second metal layer of the stacked plurality of metal layers different from the first layer of the stacked plurality of metal layers; and
a conductor above the interconnect structure and electrically coupling the TSV to the first and the second conductive vias.

2. The device of claim 1, wherein the TSV extends completely through the substrate.

3. The device of claim 1, wherein the TSV and the first and the second conductive vias form a continuous conductor with no diffusion barrier layer separating the TSV from the first and the second conductive vias.

4. The device of claim 1, wherein:
the first conductive via has a first width when viewed from cross section and a first height extending from topmost surface to bottommost surface of the first conductive via;
the second conductive via has a second width when viewed from cross section and a second height extending from topmost surface to bottommost surface of the second conductive via;
the TSV has a third width when viewed from cross section and a third height extending from topmost surface to bottommost surface of the TSV;
the third width is greater than the second width and the first width and the third height is greater than the second height and the first height; and
the second width is greater than the first width and the second height is greater than the first height.

5. The device of claim 1, wherein the TSV comprises a metal selected from the group consisting of copper, copper alloys, aluminum, silver, and gold.

6. The device of claim 1, further comprising a third deep conductive via extending from the top surface of the passivation layer to land on a third metal pad in a third one of the stacked plurality of metallization layers different from the first one and the second one.

7. The device of claim 1, wherein:
the second conductive via lands on the first metal pad.

8. The device of claim 1, further comprising a barrier layer encompassing the TSV.

9. The device of claim 8, wherein the barrier layer comprises a material selected from the group consisting of titanium, titanium nitride, tantalum, tantalum nitride, and combinations thereof.

10. A device comprising:
a substrate;
an interconnect structure over the substrate, the interconnect structure comprising:
a plurality of metallization layers comprising:
a bottom metallization layer (M1) including a bottom conductive feature embedded in a bottom dielectric layer;
an intermediate metallization layer (M2) over the M1 layer the intermediate metallization layer including an intermediate conductive feature embedded in an intermediate dielectric layer;
a second metallization layer (M3) over the M2 the second metallization layer including an second conductive feature embedded in a second dielectric layer; and
a top metallization layer (Mtop) over the M2 the top metallization layer including an top conductive feature embedded in an top dielectric layer; and
a through-substrate via (TSV) extending from the Mtop to a bottom surface of the substrate;
a passivation layer, different than the top dielectric layer over the top dielectric layer;
a first conductive via laterally spaced apart from the TSV and extending from a top surface of the passivation layer and physically and electrically contacting the intermediate conductive feature of the M2;
a second conductive via laterally spaced apart from the TSV and extending from a top surface of the passivation layer and physically and electrically contacting the second conductive feature of the M3, the first conductive via and the second conductive via being on the same side of the TSV; and
a metal line electrically connecting the TSV and one of the first conductive via and the second conductive via.

11. The device of claim 10, wherein the passivation layer is formed of a non-low-k dielectric material.

12. The device of claim 10, wherein the TSV and the first and the second conductive vias form a continuous region with no diffusion barrier layer separating the TSV from the first and the second conductive vias.

13. The device of claim 10, wherein:
the first conductive via has a first width when viewed from cross section and a first height extending from topmost surface to bottommost surface of the first conductive via;
the second conductive via has a second width when viewed from cross section and a second height extending from topmost surface to bottommost surface of the second conductive via;
the TSV has a third width when viewed from cross section and a third height extending from topmost surface to bottommost surface of the TSV;
the third width is greater than the second width and the first width and the third height is greater than the second height and the first height; and
the second width is greater than the first width and the second height is greater than the first height.

14. The device of claim 10, further comprising:
a metal bump over the passivation layer, the metal bump disposed outside a lateral extent of the metal line.

15. The device of claim 10, further comprising:
an interlayer dielectric (ILD) disposed over the substrate and under the plurality of metallization layers.

16. The device of claim 11, further comprising a third deep conductive via extending from the top surface of the dielectric layer to land on a metal pad in a third one of the plurality of metallization layers different from the first one and the second one.

17. The device of claim 16, wherein the metal pad is positioned in a bottommost level of the plurality of metallization layers.

18. A device comprising:
a plurality of dielectric layers;
a plurality of metallization layers formed respectively in the plurality of dielectric layers;
a first conductive via extending from the top level of the plurality of dielectric layers through at least two layers of the plurality of dielectric layers and physically and electrically connecting with a first metallization layer of the plurality of metallization layers;
a second conductive via extending from the top level of the plurality of dielectric layers through at least three layers of the plurality of dielectric layers and physically and electrically connecting with a second metallization layer of the plurality of metallization layers, the second metallization layer being above the first metallization layer;
a metal line over the top level of the plurality of dielectric layers, the metal line electrically connecting the first conductive via to a through-substrate via (TSV), the metal line, the TSV, and the first conductive via comprising a single, continuous and homogenous conductive feature extending unbroken from the first metallization layer to the TSV; and
a passivation layer covering the metal line.

19. The device of claim 18, further comprising a second deep conductive via extending from the plurality of metallization layers and contacting a second metal pad in the plurality of metallization layers.

20. The device of claim 19, wherein the plurality of metallization layers includes a stack of metallization layers and wherein the metal pad and the second metal pad are on different metallization layers.

* * * * *